(12) United States Patent
Sinha et al.

(10) Patent No.: US 11,626,178 B2
(45) Date of Patent: Apr. 11, 2023

(54) PACKETIZED POWER-ON-SELF-TEST CONTROLLER FOR BUILT-IN SELF-TEST

(71) Applicant: Synopsys, Inc., Mountain View, CA (US)

(72) Inventors: Anubhav Sinha, Hyderabad (IN); Ramalingam Kolisetti, Karempudi (IN); Amit Gopal M. Purohit, Bangalore (IN); Sai Manish Rao Marru, Hyderabad (IN); Sahil Soni, Bangalore (IN); Salvatore Talluto, Agrate Brianza (IT)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/449,548

(22) Filed: Sep. 30, 2021

(65) Prior Publication Data

US 2022/0108760 A1 Apr. 7, 2022

(30) Foreign Application Priority Data

Oct. 2, 2020 (IN) .............................. 202041042929

(51) Int. Cl.
*G11C 29/00* (2006.01)
*G11C 29/10* (2006.01)
*G11C 29/46* (2006.01)
*G11C 29/36* (2006.01)

(52) U.S. Cl.
CPC .............. *G11C 29/10* (2013.01); *G11C 29/36* (2013.01); *G11C 29/46* (2013.01); *G11C 2029/3602* (2013.01)

(58) Field of Classification Search
CPC ......... G11C 29/10; G11C 29/36; G11C 29/46; G11C 2029/3602
See application file for complete search history.

(56) References Cited

U.S. PATENT DOCUMENTS

| 9,983,262 | B1 * | 5/2018 | Track | G01R 31/31853 |
| 2009/0024885 | A1 * | 1/2009 | Anzou | G11C 29/16 |
| | | | | 714/E11.169 |
| 2017/0162276 | A1 * | 6/2017 | Ok | G11C 29/36 |
| 2019/0355436 | A1 * | 11/2019 | Shin | G11C 29/1201 |

* cited by examiner

*Primary Examiner* — Christine T. Tu
(74) *Attorney, Agent, or Firm* — Patterson + Sheridan, LLP

(57) ABSTRACT

Techniques for testing an integrated circuit (IC) are disclosed. A controller in the IC retrieves first testing data from a first memory in the IC. The controller transmits the first testing data to a first built-in self-test (BIST) core. The controller receives a response from the first BIST core, relating to a test at the first BIST core using the first testing data. The controller determines a status of the test relating to the IC based on the response.

19 Claims, 12 Drawing Sheets

660

| Programming Sequence - Instruction + Data Register Access |
|---|
| Select Instruction |
| Select Data Register – 1 |
| Number of Data Packets to Follow |
| Data Packet #1 |
| Data Packet #2 |
| - |
| - |
| - |
| Data Packet #N |
| Burst #1 End (NOP) |
| Select Data Register – 2 |
| Number of data packets to follow |
| Data Packet #1 |
| Data Packet #2 |
| - |
| - |
| - |
| Data Packet #N |
| - |
| - |
| - |
| - |
| - |
| Burst #2 End (NOP) |
| End of Test |

FIG. 6E

PACKETIZED POWER-ON-SELF-TEST CONTROLLER FOR BUILT-IN SELF-TEST

CROSS-REFERENCE TO RELATED APPLICATION

This application claims priority to and the benefit of India Patent Application No. 202041042929, filed on Oct. 2, 2020, which is incorporated by reference in its entirety.

TECHNICAL FIELD

The present disclosure generally relates to a built-in self-test (BIST) system, and more specifically, to a packetized power-on-self-test controller for BIST in an integrated circuit (IC).

BACKGROUND

System-on-chip (SoC) integrated circuits (ICs) can be used in mission critical applications (e.g., automotive applications, medical applications, and communication network applications). For such applications, it is important to test a system (e.g., an SoC) before the system enters into a functional mode. For example, testing can be performed on startup, during operation, on shutdown, etc. Testing can identify potential faults and avoid operating with a faulty system, which can lead to unpredictable functional operation. SoCs, and other ICs, can be tested using functional verification, structural verification, or both.

Typically, functional verification requires more vectors or patterns than structural testing, to achieve the same test coverage. But structural testing can be challenging in practice, because it is typically performed after silicon bring-up, when test related pins have been tied off. Structural test vectors cannot be applied to the test pins at this stage (e.g., once automatic test equipment (ATE) operation completes), because the test pins have been tied off.

SUMMARY

Embodiments include a method. The method includes retrieving, by a controller in an integrated circuit (IC), first testing data from a first memory in the IC. The method further includes transmitting, by the controller, the first testing data to a first built-in self-test (BIST) core. The method further includes receiving, by the controller, a response from the first BIST core, relating to a test at the first BIST core using the first testing data. The method further includes determining, by the controller, a status of the test relating to the IC based on the response.

Embodiments further include an integrated circuit (IC). The IC includes a plurality of rings, each ring including a respective plurality of built-in self-test (BIST) cores. The IC further includes a ring selector, a first memory storing instructions, and a controller, coupled with the first memory and to execute the instruction. The instructions, when executed, cause the controller to retrieve testing data. The testing data relates to testing by one of the plurality of BIST cores. The instructions, when executed, further cause the controller to transmit a first instruction to the ring selector indicating selection of a first ring including a first BIST core, from the plurality of rings, each of the plurality of rings including a respective plurality of BIST cores. The instructions, when executed, further cause the controller to transmit the testing data from the controller to the first BIST core. The instructions, when executed, further cause the controller to receive a response, at the controller from the first BIST core, relating to operation of a test at the first BIST core using the testing data. The instructions, when executed, further cause the controller to determine a status of testing relating to the IC, at the controller, based on the response.

Embodiments include a further method. The method includes receiving, at a secondary controller in an integrated circuit (IC), a trigger message from a primary controller in the IC. In response, the method includes retrieving, using the secondary controller, testing data from a memory in the IC, transmitting the testing data from the secondary controller to a first built-in self-test (BIST) core associated with a first ring comprising a first plurality of BIST cores, where the first ring is one of a plurality of rings in the IC, each of the plurality of rings comprising a respective plurality of BIST cores, receiving a response, from the first BIST core, relating to operation of a test at the first BIST core using the testing data, and determining a status of testing relating to the IC based on the response.

BRIEF DESCRIPTION OF THE DRAWINGS

The disclosure will be understood more fully from the detailed description given below and from the accompanying figures of examples described herein. The figures are used to provide knowledge and understanding of examples described herein and do not limit the scope of the disclosure to these specific examples. Furthermore, the figures are not necessarily drawn to scale.

FIG. 6E illustrates an example packet sequence structure, according at an embodiment.

DETAILED DESCRIPTION

One possible solution for structural testing (e.g., for an SoC or another IC) is to apply test vectors through a central processing unit (CPU) as part of an in-system-test (IST). But this solution has some drawbacks. For example, applying test vectors through a CPU consumes bandwidth of the CPU and can affect performance. During power on, a CPU typically has a large workload related to operation of the SoC. Adding additional responsibility for applying test vectors and debugging potential failures can significantly impact performance. Further, some SoCs (and other ICs) do not have CPUs and so cannot have test vectors applied through a CPU.

Figure 2A:
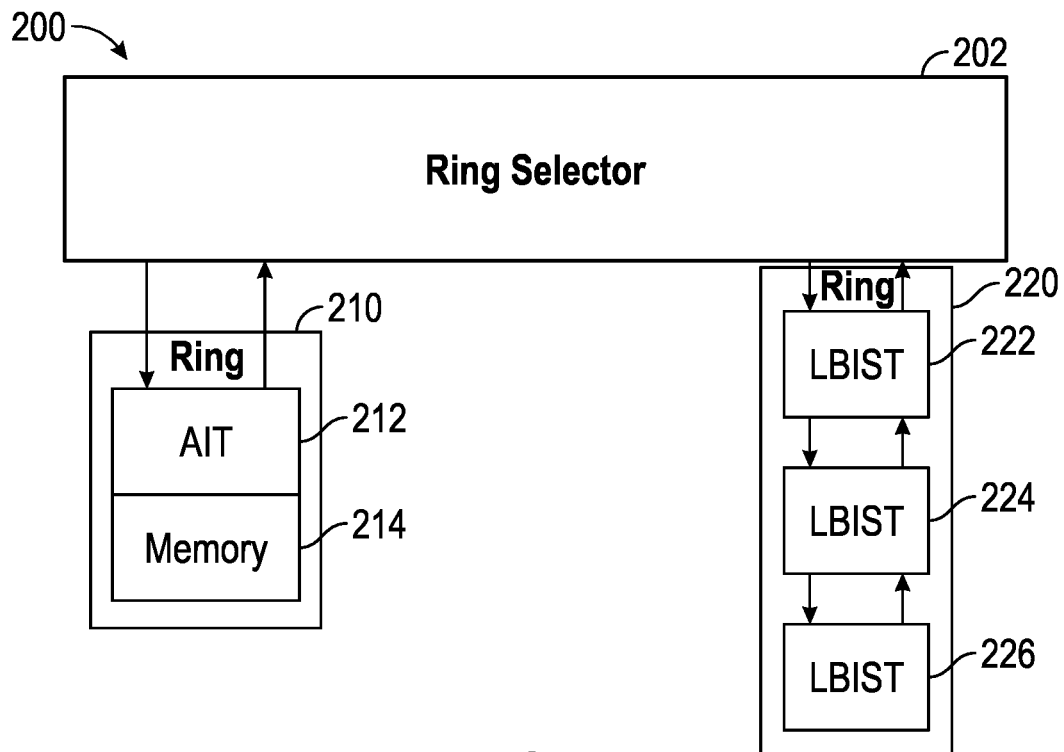
FIG. 2A illustrates an example autonomous in-system test (AIT) and logic built-in self-test (LBIST) architecture, according at an embodiment.
Figure 2B:
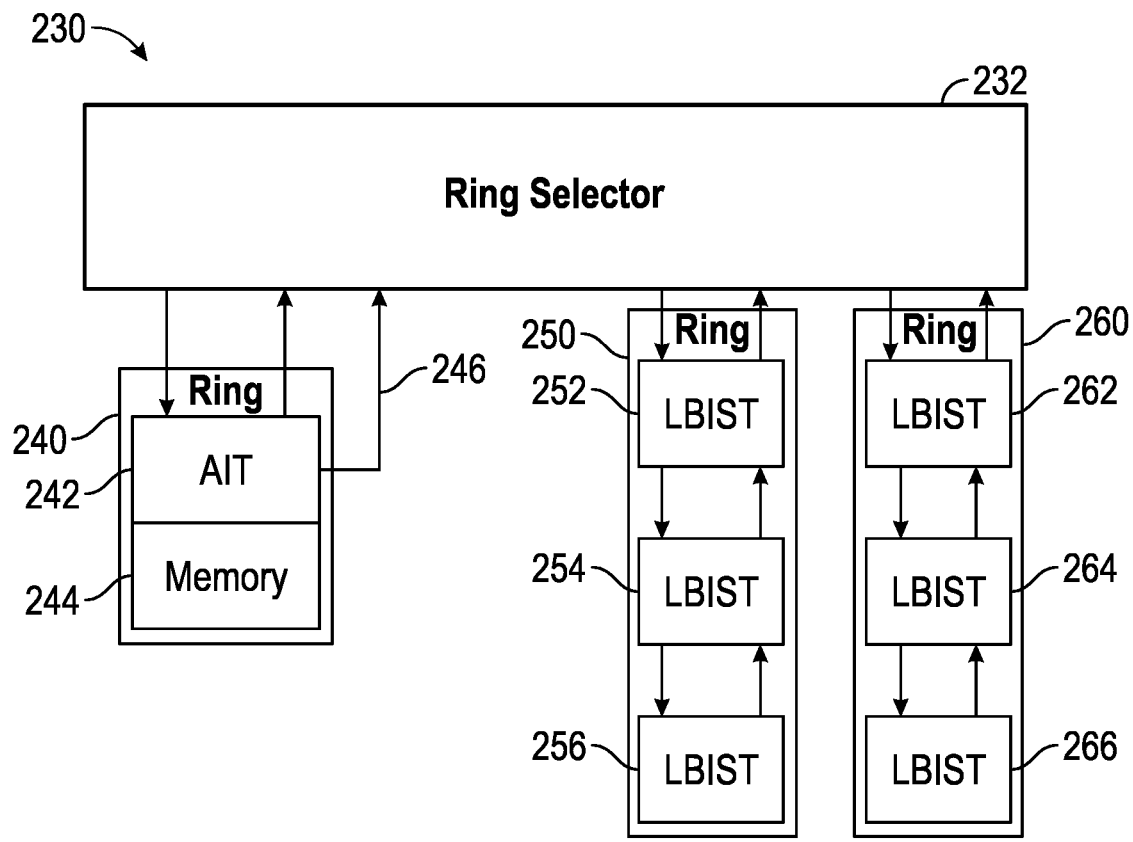
FIG. 2B illustrates a further example AIT and LBIST architecture, according at an embodiment.

Another solution is to use an AIT and logic built-in self-test (LBIST) solution (e.g., embedded in the SoC). For example, as illustrated in FIGS. 2A and 2B, an AIT controller and a group of LBIST cores can be included in a SoC. In an embodiment, LBIST cores are hierarchical design modules (e.g., for hardware or software used for built-in self-test) which contain the LBIST instructions used to test a design (e.g., used to test an SoC and its components). The AIT controller can execute self tests for the SoC, and the components included on the SoC, using the LBIST cores. For example, in an embodiment AIT is an autonomous system with minimal area overhead, which can apply test vectors, consumed by one or more LBIST cores, for structural verification during multiple stages of SoC development and operation, including during ATE testing, during power on, during power off, and during operation (e.g., on demand). In an embodiment, AIT does not affect CPU performance, and can perform ATE functionalities (e.g., applying input test stimulus, comparing expected responses with actual responses, and giving PASS/FAIL status).

In an embodiment, AIT can LBIST features to test in-system mission critical applications with relatively low pin count and memory requirements. For example, once LBIST pattern generation completes (e.g., to detect structural faults), LBIST test patterns are converted into AIT packets which define the instructions and operations executed by the AIT. For example, the LBIST test patterns can be converted into AIT packets using an AIT software conversion program developed for the purpose (e.g., as described further below with regard to FIG. 6E). AIT packets can be stored in memory. Once AIT operation starts, an AIT system can fetch data content from memory to apply during LBIST, fetch a response, and compare the response with expected values to determine whether the result of the test is a pass or fail.

In an embodiment, AIT complies with the IEEE 1500 design-for-test (DFT) standard (e.g., for data transmission). This is merely one example, and any suitable protocol could be used (e.g., the IEEE 1687 standard). Further, in an embodiment, AIT is packet-based and applying inputs and comparing output responses can be done using the AIT packet structure, described further below in relation to FIG. 6E. Further, in an embodiment, an AIT solution includes both software and hardware components. For example, the software component, that is performed by a processor (e.g., on the IC or connected to the IC), can be responsible for generating AIT compliant content and packets from existing LBIST patterns. The hardware component can be responsible for fetching AIT compliant content and packets from a memory, decoding the packets, applying the content to LBIST cores, fetching LBIST responses, and comparing the LBIST responses with expected values and generating a pass or fail status. These are merely examples, and any other suitable combination of hardware and software can be used. Alternatively, or in addition, an entirely hardware or entirely software embodiment can be used.

In an embodiment, one or more of the described AIT techniques have additional advantages. For example, AIT can, in some embodiments, provide a fire-and-forget mechanism, in which there is no need to monitor AIT continuously to get overall system status. AIT can operate independently without requiring CPU bandwidth and affecting performance. AIT can be triggered, and can enter into functional mode after the triggering. Remaining activities will be carried out by AIT itself. As another example, AIT can be triggered in multiple ways (e.g., through and AIT pin interface or through a data transmission interface like the IEEE 1500 interface), and the AIT trigger mechanism can be designed so that an undesired entrance into AIT mode is prohibited.

Figure 1:
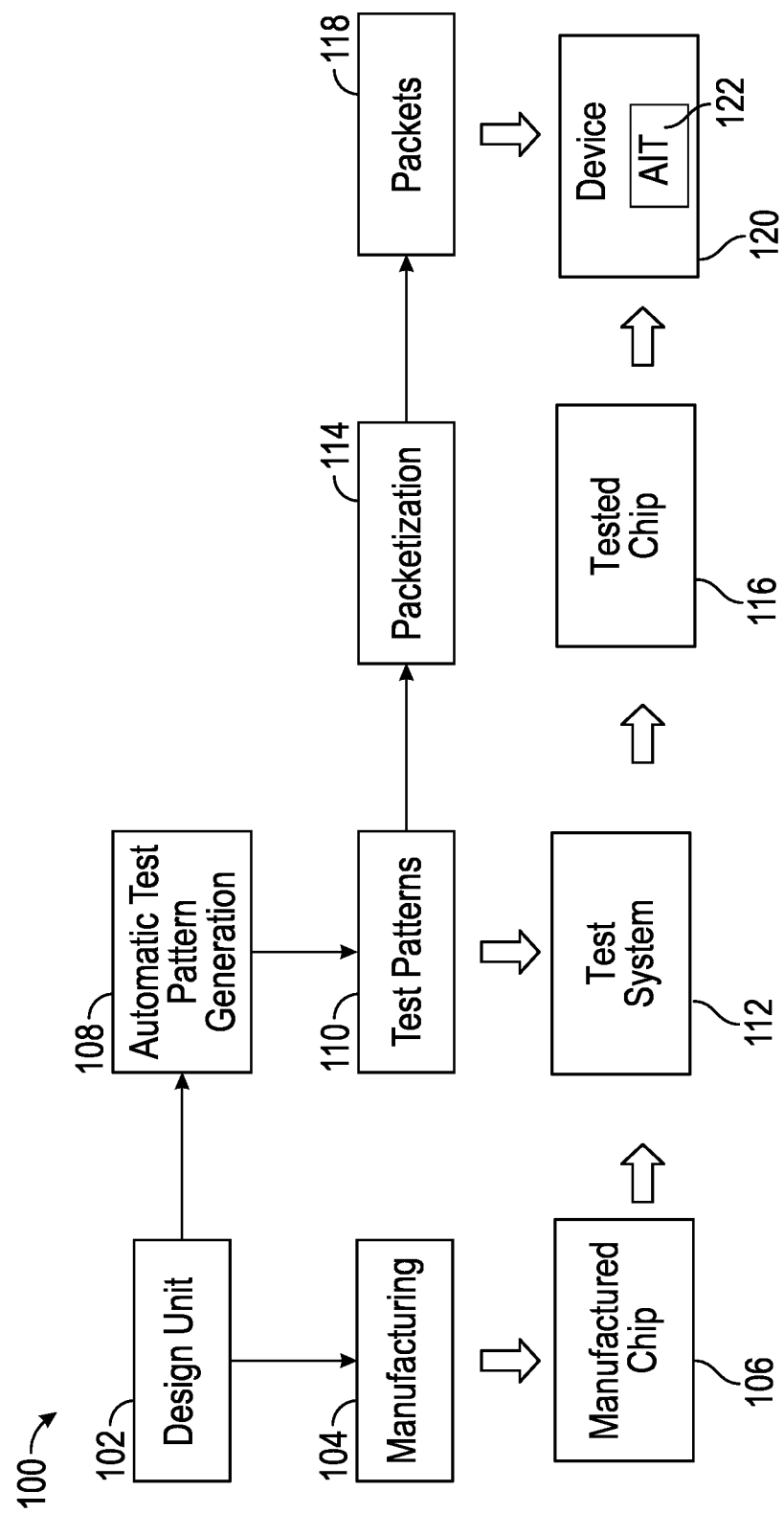
FIG. 1 illustrates an example IC testing environment, according to one embodiment.

FIG. 1 illustrates an example IC testing environment, according to one embodiment. As discussed above, an IC (e.g., a SOC) can be tested after manufacture (e.g., using an ATE). But for mission critical applications, including automotive applications, medical applications, and communication network applications, among others, the IC can also be tested before, during, and after operation. In an embodiment, an IC testing environment 100 illustrates both manufacturing testing and in-system testing.

In an embodiment, a design unit 102 is used for manufacturing 104 of a manufactured chip 106 (e.g., an SoC). For example, as discussed further below with regard to FIG. 7, an IC design (e.g., a design unit 102) can be used to fabricate, package, and assemble a manufactured chip 106.

In an embodiment, the design unit 102 is further used for automatic test pattern generation (ATPG) 108. For example, the design unit 102 can be used to generate a number of automatic test patterns 110. These test patterns 110 can be used for manufacturing testing 112. In an embodiment, the manufacturing testing 112 can be used to identify manufacturing errors or flaws in the manufactured chip 106 (e.g., using ATE). After completion of the manufacturing testing 112, the manufactured chip 106 can be considered a tested chip 116.

As discussed further below with regard to FIG. 4, the test patterns 110 can further undergo packetization 114 to generate packets 118. For example, the packetization 114 can take place in connection with manufacturing, and the packets can be stored in a suitable memory associated with the tested chip 116. This is merely an example, and the packetization can occur at any suitable point, including after manufacturing. In an embodiment, these packets can be used for in-system testing of the tested chip 116 within a device 120 (e.g., testing before, during, or after operation of the tested chip 116 within the device 120). The device 120 may be an automotive device or a device providing a mission-critical application. For example, the packets can be used by an AIT controller 122 using LBIST, as discussed further below. Thus, in an embodiment, the manufactured chip 106 is tested both after manufacturing using manufacturing testing 112, and before, during, or after, operation using in-system testing through the AIT 122. This ensures both that the manufactured chip 106 did not include errors after manufacture, and that it does not include errors during use (e.g., to avoid errors for mission-critical operations).

FIG. 2A illustrates an example AIT and LBIST architecture, according at an embodiment. An AIT and LBIST architecture 200 includes a ring 210 having an AIT controller 212, and a memory 214. A ring 220 includes three LBIST cores 222, 224, and 226.

A ring selector 202 provides an interface between the ring 210 and the ring 220. In an embodiment, the ring selector 202 is used for an interface between multiple rings (e.g., the ring 210 and the ring 220). This is merely an example, and any suitable interface can be used (e.g., a direct interface where the AIT is directly connected to the LBIST in place of, or in addition to, the ring selector 202). In an embodiment, the AIT controller 212 manages execution of tests for the LBIST cores 222, 224, and 226. The AIT controller 212 can access any, or all, of the LBIST cores 222, 224, and 226. Further, the AIT controller 212 can access multiple LBIST cores simultaneously.

While the AIT and LBIST architecture 200 illustrates communication from the AIT controller 212 to the LBIST cores 224 and 226 through the LBIST core 222, this is merely an example. Alternatively, or in addition, the AIT controller 212 can communicate with the LBIST cores 224 and 226 individually, without communicating through another LBIST core (e.g., without communicating through the LBIST core 222). For example, the AIT controller 212 can use an interface (e.g., a 1500-DFT compatible interface, an IEEE 1687 compatible interface, or any other suitable interface) for transmission to the LBIST cores 222, 224, and 226.

As an example, the AIT controller 212 can control autonomous testing (e.g., testing without an ATE or any other external test machine) using the LBIST cores 222, 224, and 226. For example, the memory 214 can store test pattern data (e.g., seed values relating to initial states for test patterns) for use during testing. The AIT controller 212 can retrieve test pattern data from the memory 214, apply the test pattern data to any (or all) of the LBIST cores 222, 224, and 226, and read responses from the LBIST cores 222, 224, and 226. In an embodiment, the data in the memory 214 is organized in packets (e.g., as discussed below with regard to FIG. 6E).

FIG. 2B illustrates a further example AIT and LBIST architecture, according at an embodiment. In an embodiment, an AIT and LBIST architecture 230 is similar to the AIT and LBIST architecture 200 illustrated in FIG. 2A, with an additional ring including additional LBIST cores. A ring 240 includes an AIT controller 242 and a memory 244. A ring 250 includes three LBIST cores 252, 254, and 256. A ring 260 includes three more LBIST core 262, 264, and 266.

A ring selector 232 provides an interface between the AIT controller 242 in the ring 240 and the rings 250 and 260. For example, the AIT controller 242 can provide a ring select (select ring) instruction 246 to the ring selector 232 to select between the rings 250 and 260. In an embodiment, an instruction is defined in the packets to provide the select ring instruction 246. When the select ring instruction 246 is present in the memory 244 (e.g., packetized memory), the select ring instruction 246 is decoded by the AIT controller 242, and the decoded select ring instruction 246 is transmitted to the ring selector 232 and used to select the appropriate ring (e.g., the ring 250 or the ring 260).

As discussed above in relation to FIG. 2A, while the AIT and LBIST architecture 230 illustrates communication from the AIT controller 242 to the LBIST cores 254, 256, 264, and 266 through respective LBIST cores 252 and 262, this is merely an example. Alternatively, or in addition, the AIT controller 242 can communicate with the LBIST cores 254, 256, 264, and 266 individually, without communicating through another LBIST core (e.g., without communicating through the LBIST cores 252 or 262). For example, the AIT controller 242 can use an interface (e.g., a 1500-DFT compatible interface, an IEEE 1687 compatible interface, or any other suitable interface) for transmission to any of the LBIST cores in the rings 250 and 260. While the AIT and LBIST architecture 230 illustrates two rings 250 and 260 with LBIST cores, this is merely an example, and any suitable number of rings with LBIST cores can be used.

Further, the AIT controller 242 can control autonomous testing using the LBIST cores 252, 254, 266, and 262, 264, and 266. For example, the memory 244 can store test pattern data (e.g., seed values relating to initial states for test patterns) for use during testing. The AIT controller 242 can retrieve test pattern data from the memory 244, can apply the test pattern data to any (or all) of the LBIST cores 252, 254, 266, and 262, 264, and 266 (e.g., by selecting between the rings 250 and 260 using the select ring instruction 246), and can read responses from the LBIST cores 252, 254, 266, and 262, 264, and 266. In an embodiment, the data in the memory 244 is organized in packets (e.g., as discussed below with regard to FIG. 6E).

Figure 2C:
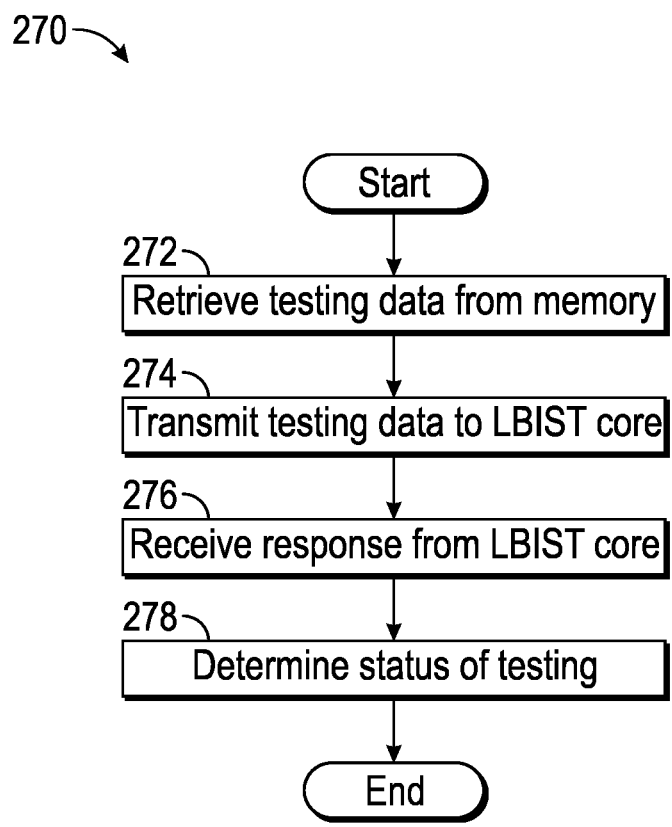
FIG. 2C is a flowchart illustrating testing in an example AIT and LBIST architecture, according to an embodiment.

FIG. 2C is a flowchart 270 illustrating testing in an example AIT and LBIST architecture, according to an embodiment. At 272, an AIT controller (e.g., the AIT controller 212 illustrated in FIG. 2A or the AIT controller 242 illustrated in FIG. 2B) retrieves testing data from a memory (e.g., the memory 214 illustrated in FIG. 2A or the memory 244 illustrated in FIG. 2B). This is discussed further above, in relation to FIGS. 2A-B, and below in relation to subsequent figures.

At 274, the AIT controller transmits the testing data to an LBIST core (e.g., one or more of the LBIST cores 222, 224, and 226 illustrated in FIG. 2A or the LBIST cores 252, 254, 266, and 262, 264, and 266 illustrated in FIG. 2B). Further, the AIT controller can select between rings if the LBIST cores are associated with multiple different rings (e.g., the rings 250 and 260 illustrated in FIG. 2B).

At 276, the AIT controller receives a response from the LBIST core(s) (e.g., relating to a test performed at the LBIST core using the testing data). This is discussed further above, in relation to FIGS. 2A-B, and below in relation to subsequent figures. At 278, the AIT controller determines a status of testing (e.g., for an SoC) based on the response from the LBIST core(s). This is discussed further above, in relation to FIGS. 2A-B, and below in relation to subsequent figures.

Figure 3:
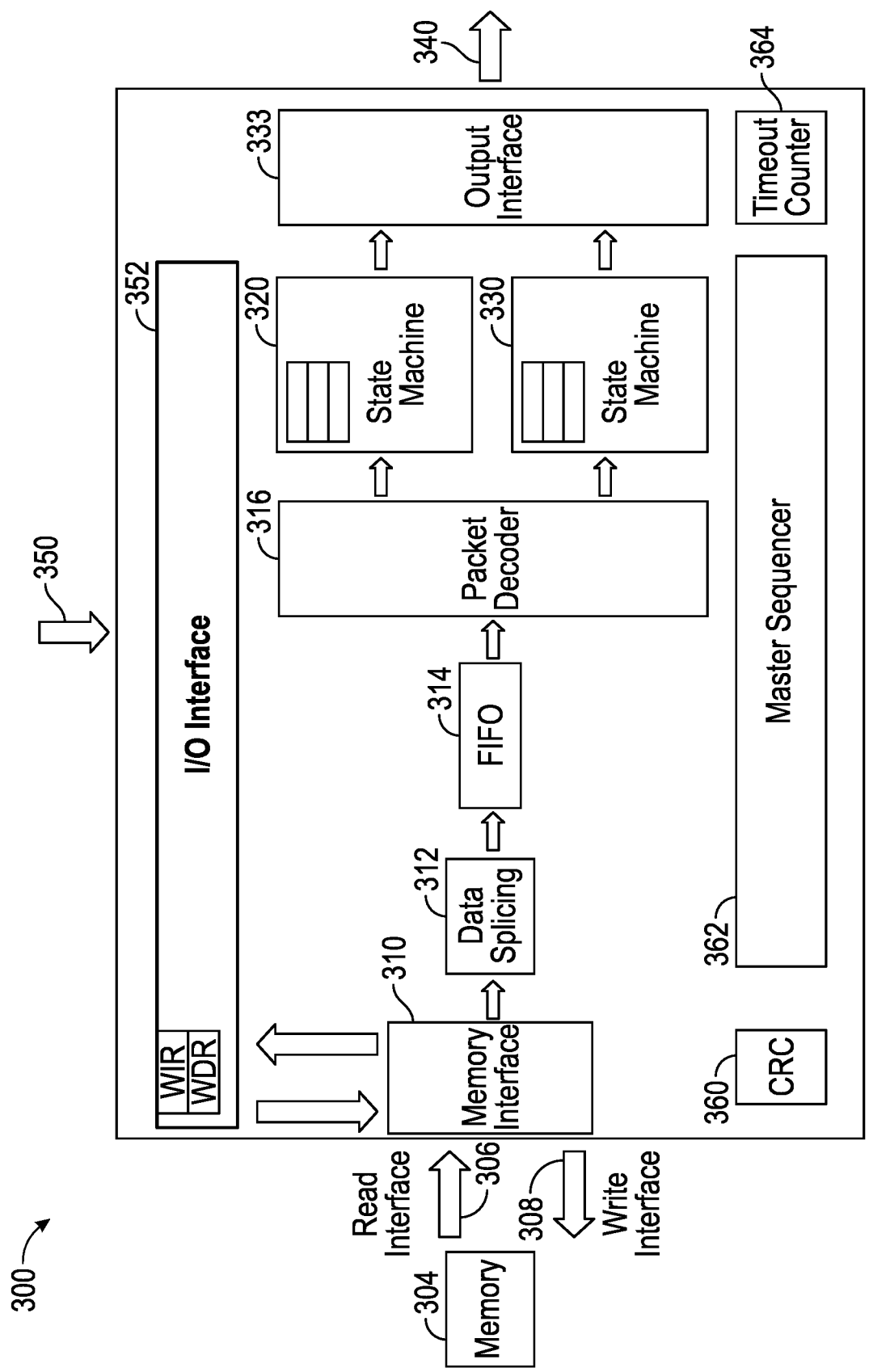
FIG. 3 illustrates an example AIT controller architecture, according at an embodiment.

FIG. 3 illustrates an example AIT controller architecture, according at an embodiment. In an embodiment, an AIT controller architecture 300 corresponds with either of the AIT controllers 212 and 242 illustrated in FIGS. 2A-B. As illustrated, the AIT controller architecture 300 includes a memory interface 310 (e.g., for interfacing with the memories 214 and 244 illustrated in FIGS. 2A-B).

In an embodiment, the AIT controller architecture 300 is organized as a sequenced state machine. For example, an instruction can be retrieved from memory 304 (e.g., static random access memory (SRAM), read only memory (ROM), etc.), and provided to an internal state machine 320 (e.g., a finite state machine). In an embodiment, the memory 304 corresponds with the memories 214 and 244 illustrated in FIGS. 2A-B. For example, the instruction can be provided to the state machine 320 through the read interface 306 and the memory interface 310, a data splicing element 312, a first-in-first-out memory (FIFO) 314, and a packet decoder 316. In an embodiment, the instruction is stored in packet format in the memory 304, and is decoded using the packet decoder 316. As another example, data can be retrieved from memory 304 and provided to an alternative state machine 330. In an embodiment, the data is stored in packet format in the memory 304, and is decoded using the packet decoder 316. In an embodiment, the state machine 320 is a finite state machine which, driven by the packet decoder 316, applies control operations. For example, the state machine 320 can change the state of LBIST cores and prepare the LBIST cores to accept data. Further, in an embodiment, the state machine 330 is an input/output execution engine (e.g., for the interfaces 350 and 340), driven by the packet decoder

316. For example, the state machine 330 can provide data to LBIST cores, while the state machine 320 can provide instructions.

Input to the AIT controller architecture 300 is provided through the interface 350 (e.g., an IEEE 1500 compatible interface). For example, the interface 350 can be used to interface the AIT controller architecture with other components (e.g., with LBIST cores using a suitable ring selector, as illustrated in FIGS. 2A-B). In an embodiment, the input is provided using the I/O interface 352. This input can include, for example, a trigger to begin testing (e.g., a trigger message). This trigger can be provided by an external interface, a state machine, a CPU, etc. Further, the trigger can be provided through a user interface (e.g., through additional pins). The interface 350 can also be used to program the memory 304 (e.g., through the memory interface 310 using a write interface 308). In an embodiment, the memory 304 includes a RAM (e.g., an SRAM) that can be programmed. Alternatively, or in addition, the memory 304 includes a ROM that cannot be programmed.

In an embodiment, the AIT controller architecture 300 communicates with LBIST cores (e.g., the LBIST cores 222, 224, 226 illustrated in FIG. 2A and the LBIST cores 252, 254, 256, 262, 264, and 266 illustrated in FIG. 2B) using an interface 340 (e.g., an IEEE 1500 compatible interface) and an output interface 333. For example, the AIT controller architecture 300 can use the interface 340 for bi-directional communication with the LBIST cores. Further, the AIT architecture can include additional components, including a cyclic redundancy check (CRC) module 360 (e.g., for performing CRC checks on data stored in the memory 304), a timeout counter 364, and a master sequencer 362.

Figure 4:
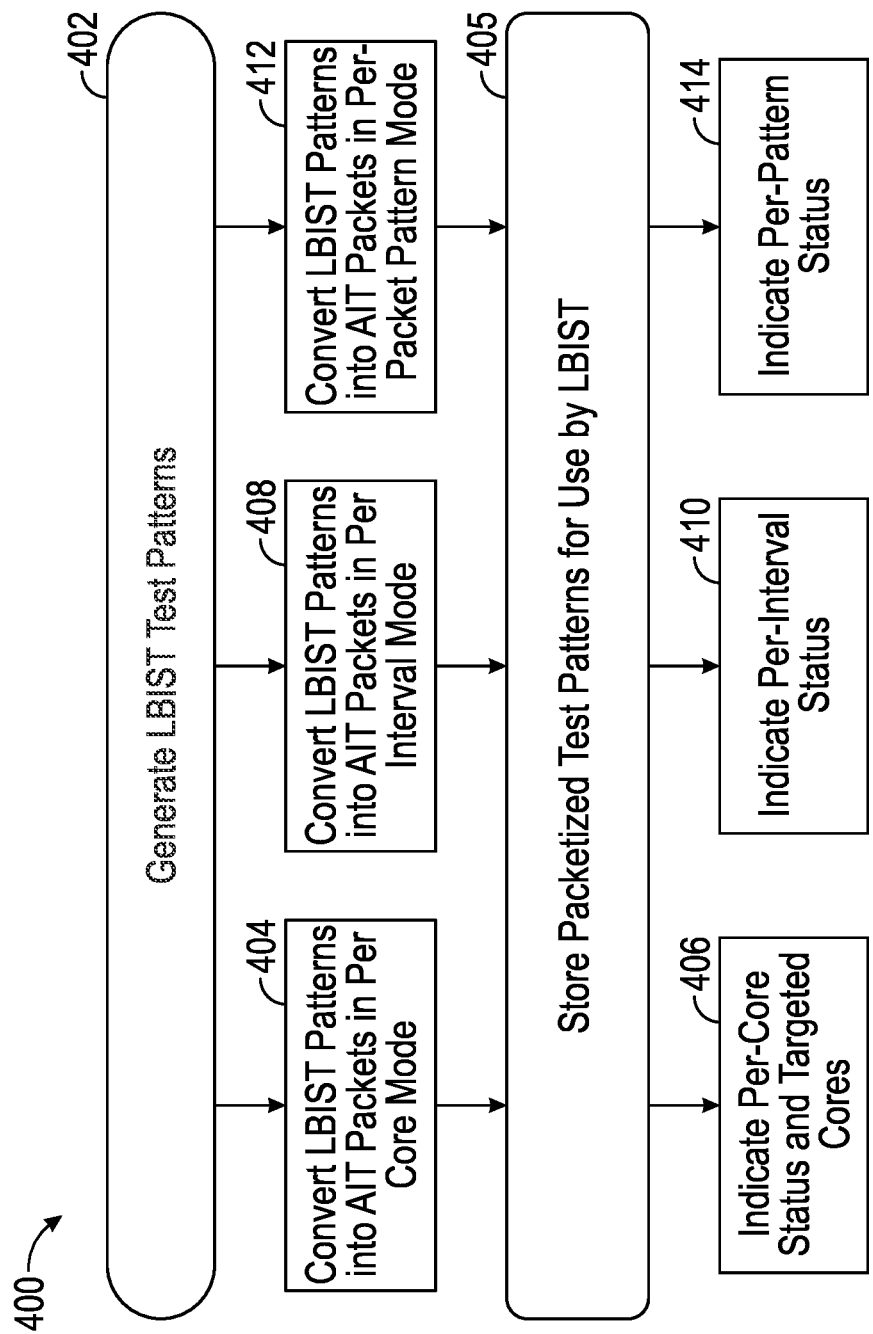
FIG. 4 is a flowchart illustrating AIT granularity, according at an embodiment

FIG. 4 is a flowchart illustrating AIT granularity, according at an embodiment. In one embodiment, an AIT controller (e.g., the AIT controller 212 illustrated in FIG. 2A or 242 illustrated in FIG. 2B) can indicate overall system PASS/FAIL. For example, the AIT controller can compare LBIST outputs with expected outputs (e.g., stored inside the memory 214 illustrated in FIG. 2A or the memory 244 illustrated in FIG. 2B) and indicate a global PASS/FAIL. In an embodiment, if any LBIST output does not match the expected output, the AIT controller indicates a global FAIL.

Alternatively, or in addition, the AIT controller can indicate a status of each LBIST core (e.g., each of the LBIST cores 222, 224, 226 illustrated in FIG. 2A and the LBIST cores 252, 254, 256, 262, 264, and 266 illustrated in FIG. 2B). For example, at 402, an automatic test pattern generation software program (e.g., the automatic test pattern generation 108 illustrated in FIG. 1) generates LBIST test patterns. At 404, the AIT controller converts the LBIST test patterns into AIT packets in a per-core mode. At 405, the AIT controller stores the packetized test patterns for use by LBIST (e.g., in the memory 214 illustrated in FIG. 2A or the memory 244 illustrated in FIG. 2B). At 406, the AIT controller indicates a status for each LBIST core (e.g., PASS/FAIL). In an embodiment, the AIT controller also indicates which LBIST cores are targeted (e.g., for testing). Further, in an embodiment, the AIT controller can stop operation of the IC (e.g., the SOC) if the status of any LBIST core indicates failure.

Further, the AIT controller can indicate a status for each LBIST interval (e.g., in a per-interval mode). For example, an interval can be a set of patterns (e.g., a complete set) that can be executed independently by one LBIST core (e.g., the LBIST can act independently during testing for the interval). After generating the LBIST test patterns, at 408, the AIT controller converts the LBIST test patterns into AIT packets in a per-interval mode. At 405, the AIT controller stores the packetized test patterns for use by LBIST (e.g., in the memory 214 illustrated in FIG. 2A or the memory 244 illustrated in FIG. 2B). At 410, the AIT controller indicates a status for each interval (e.g., PASS/FAIL). In an embodiment, the AIT controller can be configured to stop operation of the IC (e.g., the SOC) if the status of any interval indicates failure.

Alternatively, or in addition, the AIT controller can indicate a status for each pattern within an LBIST interval (e.g., in a per-pattern mode). After generating the LBIST test patterns, at 412, the AIT controller converts the LBIST test patterns into AIT packets in a per-pattern mode. At 405, the AIT controller stores the packetized test patterns for use by LBIST (e.g., in the memory 214 illustrated in FIG. 2A or the memory 244 illustrated in FIG. 2B). At 414, the AIT controller indicates a status for each pattern (e.g., PASS/FAIL). In an embodiment, the AIT controller stops operation of the IC (e.g., the SOC) if the status of any pattern indicates failure.

Further, in an embodiment, the AIT controller schedules a testing sequence (e.g., an order in which LBIST cores are to be tested) for LBIST cores. For example, the AIT controller can generate AIT packets in a required order. In an embodiment, this order can be based on an execution order requirement (e.g., a testing sequence of LBIST cores) relating to the testing by the LBIST cores.

The AIT controller can be configured to produce output status for LBIST cores in multiple ways. For example, the AIT controller can provide a final status at the end of all tests. In this configuration, even if LBIST cores fail, or the AIT encounters another failure (e.g., with the AIT memory), testing will still continue, and the test status (e.g., PASS or FAIL) will be given after completion of all tests (e.g., after application of all test data stored in the AIT memory).

Alternatively, or in addition, the AIT controller can produce a test status (e.g., PASS or FAIL) immediately after failure of any test. For example, immediately after failure of any test pattern at any LBIST core. In this configuration, if the AIT encounters a failure, the test operation will no proceed further. This can help to rapidly identify early failures.

The AIT controller can also include a programmable watchdog timer. In an embodiment, the watchdog timer can indicate a maximum allocated time interval allowed for a test. Expiration of the timer can be used to indicate a failure in the testing process. In an embodiment, the AIT controller can perform any, or all, of 404, 408, and 412 in sequence, in parallel, or in any suitable combination of in sequence and in parallel.

Figure 5A:
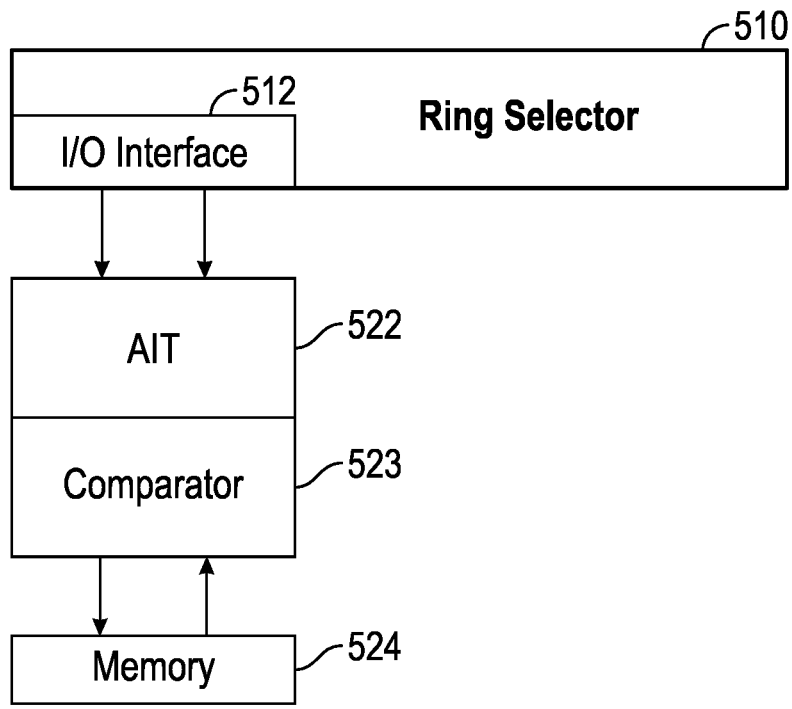
FIG. 5A illustrates a memory interface check, according at an embodiment.

FIG. 5A illustrates a memory interface check, according at an embodiment. In an embodiment, an AIT controller 522 (e.g., the AIT controller 212 illustrated in FIG. 2A or 242 illustrated in FIG. 2B) identifies an error in the memory interface between the AIT controller and a memory 524 (e.g., the memory 214 illustrated in FIG. 2A or the memory 244 illustrated in FIG. 2B), and distinguishes this error from an error in the components under test (e.g., tested using LBIST cores). The memory 524 stores AIT packets (e.g., generated by the AIT controller).

In an embodiment, the AIT controller 522 can be connected to a ring selector 510 (e.g., the ring selector 202 illustrated in FIG. 2A or the ring selector 232 illustrated in FIG. 2B) using a suitable I/O interface 512 (e.g., an IEEE 1500 interface). The AIT controller is further connected to the memory 524, and can check the interface between the AIT controller 522 and the memory 524, to confirm that there are no faults in this interface, which could lead to corrupted or incorrect AIT packets. Use of the I/O interface 512 is merely one example, and the memory 524 can receive data using any suitable connection (e.g., a direct connection).

For example, when the AIT controller 522 generates AIT packets, the AIT controller 522 can place known data at known memory address locations (e.g., in the memory 524). The AIT controller 522 can include a comparator 523. The comparator 523 can compare data obtained at the known memory address locations with the known data. If there is an error in the interface between the memory 524 and the AIT controller 522, the comparison by the comparator 523 will fail, and the AIT controller 522 can provide a FAIL status (e.g., a status indicating that the interface between the AIT controller and the memory has an error).

Figure 5B:
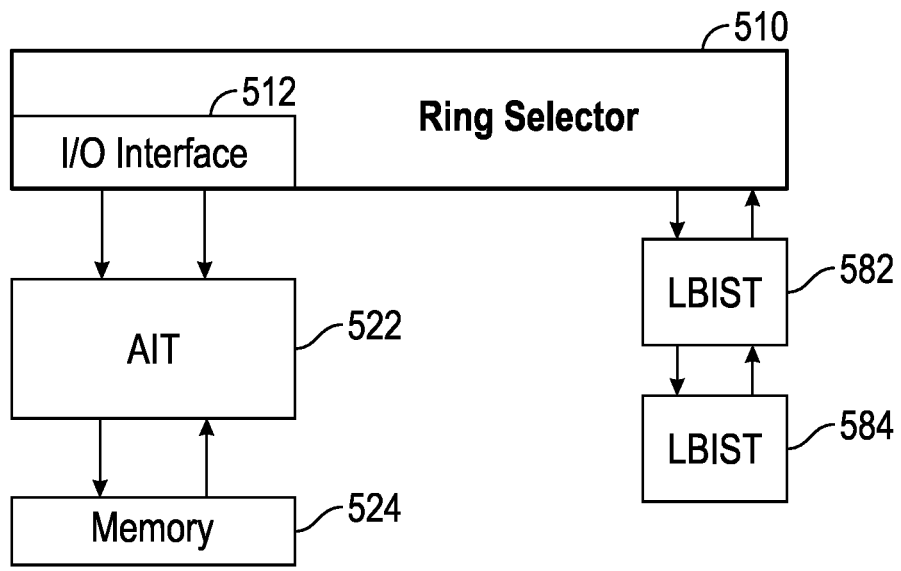
FIG. 5B illustrates a memory write through interface, according at an embodiment.

FIG. 5B illustrates a memory write through interface, according at an embodiment. In an embodiment, an AIT controller 522 can be used to load the memory. For example, the AIT controller 522 can receive data from the I/O interface 512 and the ring selector 510, and can load the data to the memory 524. In an embodiment, the I/O interface 512 accepts memory content, accumulates the content into a required memory width (e.g., performing serial to parallel conversion of input data), and delivers data to the memory 524. The AIT controller 522 can further generate suitable very large-scale integration (VLSI) values, including write enable (write_en), memory clock, and address write (write_address) values.

Further, data can be pre-fetched for the memory 524 and filled through the AIT controller 522 (e.g., when the AIT controller 522 is in a non-functional mode). In an embodiment, prefetching memory content can reduce test time, by pre-fetching the content for the memory 524 when the system is otherwise idle in its functional operation (e.g., the system is in an idle or stand-by mode).

In an embodiment, the AIT controller 522 can further perform out of order instruction execution. For example, AIT content may be very large and distributed across multiple memory banks. The AIT controller 522 can include instructions to combine memory address locations (e.g., by jumping across memory banks at required address locations).

Further, in an embodiment, the AIT controller 522 can support an immediate abort of operations. In an embodiment, an abort command can be issued at any time to halt AIT operation. The AIT operation can be halted immediately, and the AIT controller can gate off all clocks internally. For example, an AIT controller may perform testing during functional operation when a system is otherwise idle in its functional operation. If the system suddenly becomes active, the AIT controller can abort the testing operations.

Additionally, in an embodiment, the AIT controller 522 can implement data saving techniques to improve data storage in a memory 524. For example, if AIT test data includes a string of identical bit values (e.g., a string of 1s or a string of 0s), the AIT controller can replace the string of identical bit values, in the memory 524, with an AIT specific instruction. When the AIT controller 522 retrieves the specific instruction, the AIT controller 522 can transmit the instruction to LBIST cores (e.g., the LBIST cores 582 and 584) as the original stream of identical bits, without storing the bits in memory.

For example, if an element of AIT data included 80 bits of consecutive 0s used for testing by an LBIST core (e.g., the LBIST cores 582 or 584), the AIT controller 522 can replace this string of 80 bits with an instruction identifying the 80 consecutive 0s (e.g., an instruction identifying 10 bytes (i.e., 80 bits) of zeroes) and store the replacement instruction in the memory 524. When the AIT controller 522 later retrieves the instruction from the memory 524, it can replace the instruction with 80 consecutive 0s when transmitting data to the LBIST cores 582 or 584. This can significantly improve the storage used in the memory 524.

Figure 6A:
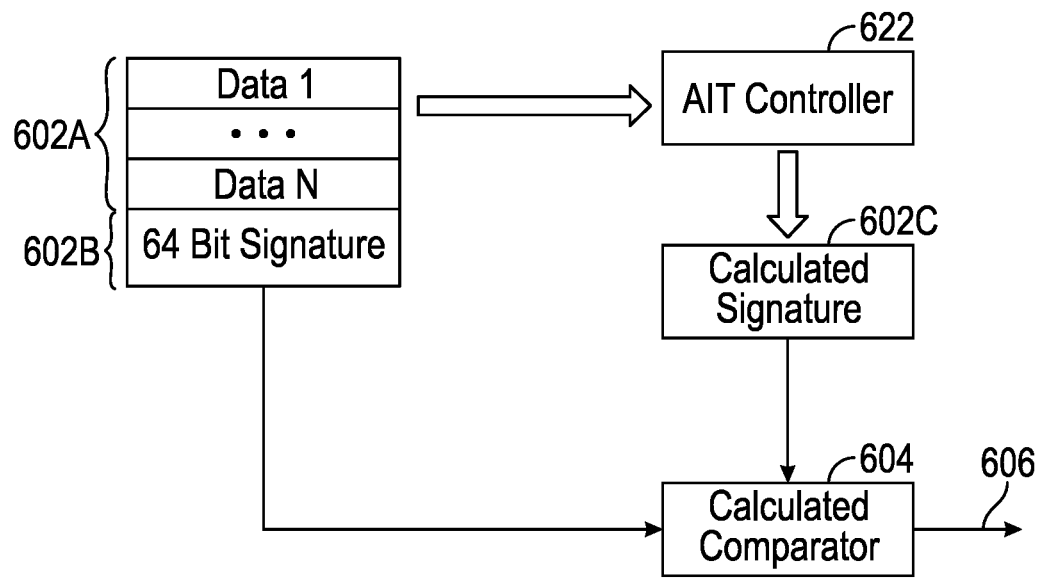
FIG. 6A illustrates AIT data checking, according at an embodiment.

FIG. 6A illustrates AIT data checking, according at an embodiment. In an embodiment, an AIT controller 622 (e.g., the AIT controller 212 illustrated in FIG. 2A or 242 illustrated in FIG. 2B) can perform data validation and correctness checks to ensure the AIT testing data is, itself, correct. For example, the AIT controller 622 can perform a CRC check as described below and illustrated in FIG. 6A.

In an embodiment, the AIT controller 622 can retrieve a CRC digital signature 602B (e.g., a 64-bit CRC digital signature) for AIT data content 602A. When the AIT controller 622 receives the data 602A, it can calculate a CRC digital signature 602C (e.g., a 64-bit CRC polynomial) for the content. At the end of a test operation, the AIT controller 622 compares the expected digital signature 602B (e.g., stored inside a memory) with the calculated digital signature 602C using a signature comparator 604 to generate a result 606. If the result 606 indicates that the expected digital signature 602B and the calculated signature 602C are the same, then the data is determined to be correct. If there are problems with the data (e.g., data corruption), the CRC digital signatures will vary and the signature check will fail.

Further, the AIT controller 622 can perform wrong packet detection. In an embodiment, this can detect incorrect or corrupted instructions in the memory. For example, when the AIT controller 622 receives data, the AIT controller 622 can decode each packet (e.g., an AIT control packet) and carry out required operations. While decoding the packets, the AIT controller 622 can identify whether it received instructions which are not supported by AIT. If so, the AIT controller 622 will not carry out the functionality and will produce an error status (e.g., "BAD INSTRUCTION DETECTED"). This can detect invalid instructions caused by structural defects, data corruption, etc.

Figure 6B:
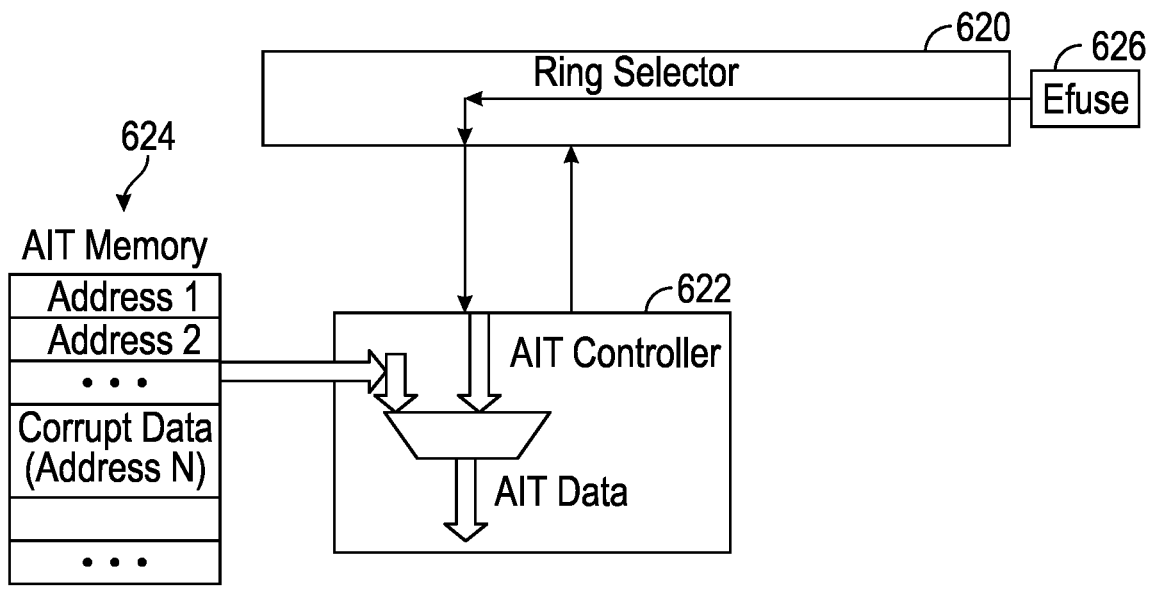
FIG. 6B illustrates test content repair for read only memory (ROM), according at an embodiment.

FIG. 6B illustrates test content repair for ROM, according at an embodiment. In an embodiment, AIT content can be stored in a memory 624 (e.g., the memory 214 illustrated in FIG. 2A or the memory 244 illustrated in FIG. 2B) that includes RAM, ROM, or both. If the AIT content is faulty, and RAM is used to store the AIT content, the content can be refilled with the correct content (e.g., as described above in relation to FIG. 5B).

If the AIT content is faulty and is stored in ROM, however, continuing AIT operations may be impossible. The ROM cannot be filled (since it is read-only) and it may have limited repair options. In an embodiment, this can be addressed through the use of an electrically programmable fuse (Efuse) 626, as illustrated in FIG. 6B.

In an embodiment, the Efuse 626 is a memory fused and programmed during manufacturing. For example, during manufacturing, a particular die may have corrupted data (e.g., determined based on testing during manufacturing). The Efuse 626 can be programmed with the corrected data (e.g., based on user input), so that the data is read from the Efuse 626 rather than the corrupted location. At a corrupted data location or memory address, the AIT controller 622 will not accept data from the memory 624 and can switch a data access mode to the Efuse 626 (e.g., using a ring selector 620). At the requested address locations, the AIT controller 622 can collect data from the Efuse 626, and use the data for AIT operation. If data is not corrupted, the AIT controller 622 can switch memory interface mode and accept data from the memory 624. In an embodiment, the AIT controller 622 can continuously switch between data sources, seamlessly, and carry out AIT operations.

Further, in an embodiment, the AIT controller 622 can support an Efuse trigger test. Efuse content can be downloaded into a memory, and the AIT controller 622 can test the Efuse contents. In an embodiment, the test can be triggered by downloading the content to the memory. The AIT controller 622 can provide a status of the Efuse trigger test (e.g., PASS or FAIL).

Figure 6C:
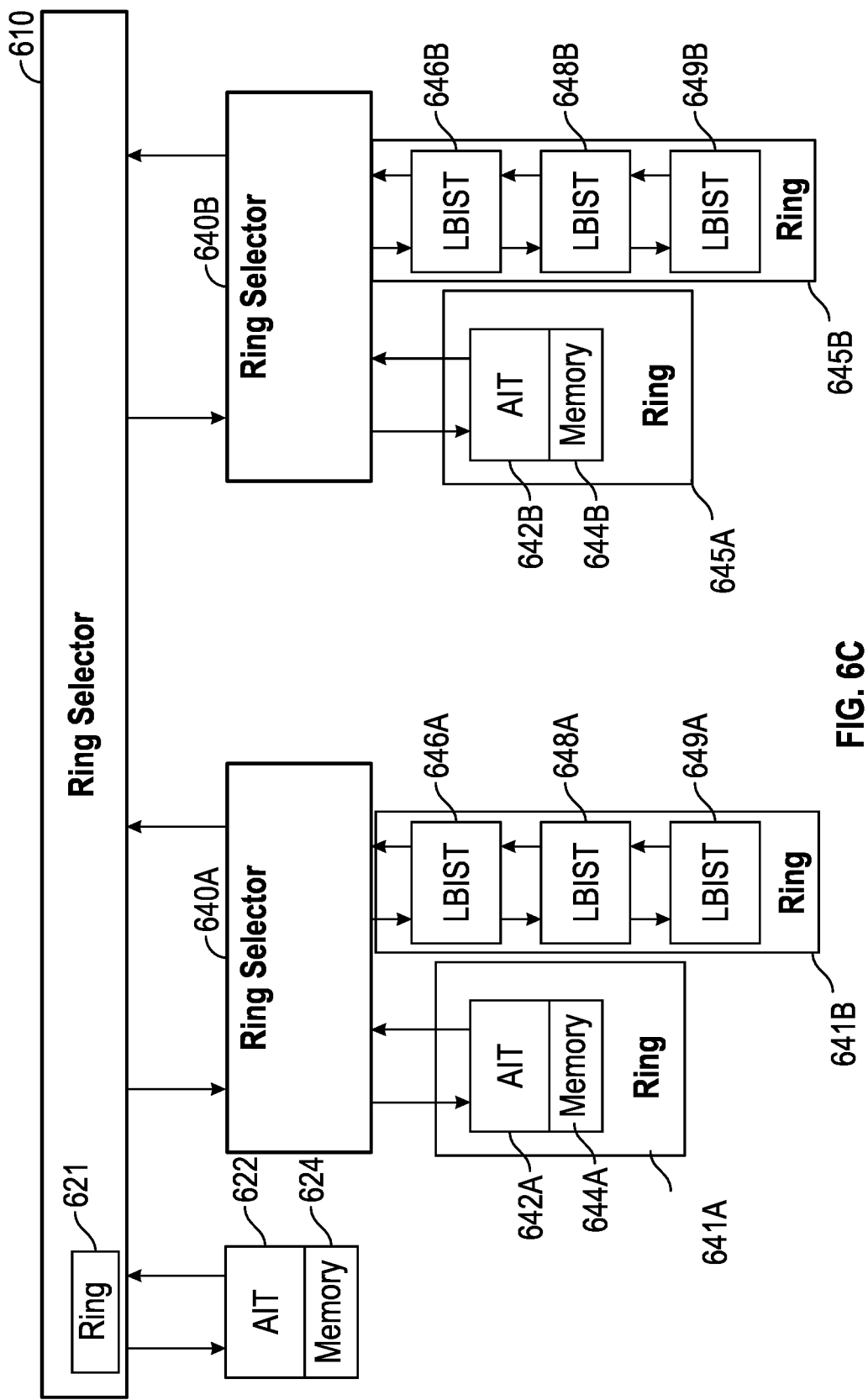
FIG. 6C illustrates primary-secondary AIT operation, according at an embodiment.

FIG. 6C illustrates primary-secondary AIT operation, according at an embodiment. In an embodiment, the AIT controller 622 can operate in a system with other AIT controllers 642A and 642B. Each AIT controller 622, 624A, and 642B can operate as either a primary or a secondary controller, depending on AIT configuration. For example, as illustrated in FIG. 6C, an AIT controller 622 can act as a primary controller, and AIT controllers 642A and 642B can act as secondary controllers. In an embodiment, an SoC includes a single primary AIT controller and multiple secondary AIT controllers.

In an embodiment, an AIT primary controller determines which AIT secondary controller is in operational mode. For example, AIT controller 622 can act as a primary and trigger AIT secondary operation by either of AIT controllers 642A or 642B, through transmitting a trigger message using ring selector logic (e.g., through the ring selectors 610, 640A, and 640B). As discussed above, in an embodiment, the ring selectors 610, 640A, and 640B are used as an interface for multiple rings (e.g., the rings 621, 641A-B, and 645A-B). This is merely an example, and any suitable interface can be used (e.g., a direct interface). Further, use of the secondary AIT controllers 642A and 642B is merely one example. In an embodiment, the primary AIT controller 622 can access the LBIST cores 646A-B, 648A-B, and 649A-B itself (e.g., through the respective ring selectors 640A-B). In an embodiment, the AIT primary controller is collects status information from all secondary controllers, and provides overall system status and individual secondary controller status. In an embodiment, an AIT primary controller can also be configured to collect status of each LBIST core (e.g., LBIST cores 646A-B, 648A-B, and 649A-B).

In an embodiment, an AIT primary controller fetches data from a memory (e.g., a memory 644A or 644B) when triggered by an AIT primary controller (e.g., using a trigger message). The AIT secondary controller further applies data content to LBIST cores (e.g., LBIST cores 646A-B, 648A-B, and 649A-B) and collects responses from LBIST cores. As discussed above in relation to FIG. 4, the AIT secondary controller can compare data in responses from LBIST cores with expected data, and provide different kinds of status in different configurations (e.g., per core, per interval, per pattern). In an embodiment, the AIT secondary controller transmits status information to the AIT primary controller via a ring selector (e.g., the ring selectors 610, 640A, and 640B).

Figure 6D:
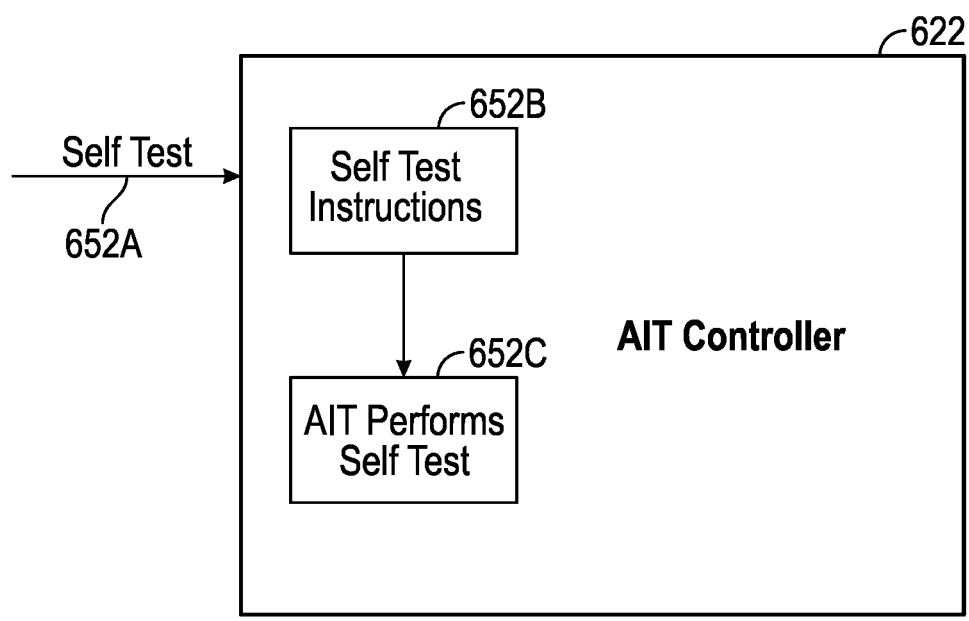
FIG. 6D illustrates AIT self testing, according at an embodiment.

FIG. 6D illustrates AIT self testing, according at an embodiment. In an embodiment, an AIT controller 622 can support self-testing 652A of the AIT controller hardware. For example, the AIT controller 622 includes self test instructions 652B. In an embodiment, the AIT controller 622 can use the self test instructions 652B to test its own hardware as part of a self test 652C. The AIT self test 652C can be triggered in multiple ways, including through a pin interface or through an interface. In an embodiment, the AIT controller 622 executes a predetermined set of instructions to exercise the various operations of AIT controller 622 (e.g., all possible AIT operations). Self-testing can help ensure that there are no faults in the AIT controller 622, itself, before an SoC enters into functional mode.

FIG. 6E illustrates an example packet sequence structure, according at an embodiment. In an embodiment, the AIT controller can operate using a custom packet structure. The AIT controller's packet decoding and execution can work by consuming bursts of data packets. The AIT controller can use control packets at the beginning of a sequence to select instructions or register access. A special control packet can be used to determine how many data packets (e.g., payload) follow in a burst.

A packet sequence structure 660 illustrates one example of an AIT packet sequence. This is merely an example, and other suitable sequence structures can be used. The AIT controller first receives a select instruction, followed by a select data register for a first burst of data packets. The AIT controller then receives an indication of the number of data packets to follow, and the identified data packets. The AIT controller receives an indication of the end of the burst. The AIT controller then receives a select data register for a second burst of data packets, followed by an indication of the number of data packets in the burst, the data packets themselves, and an indication of the end of the burst.

Figure 7:
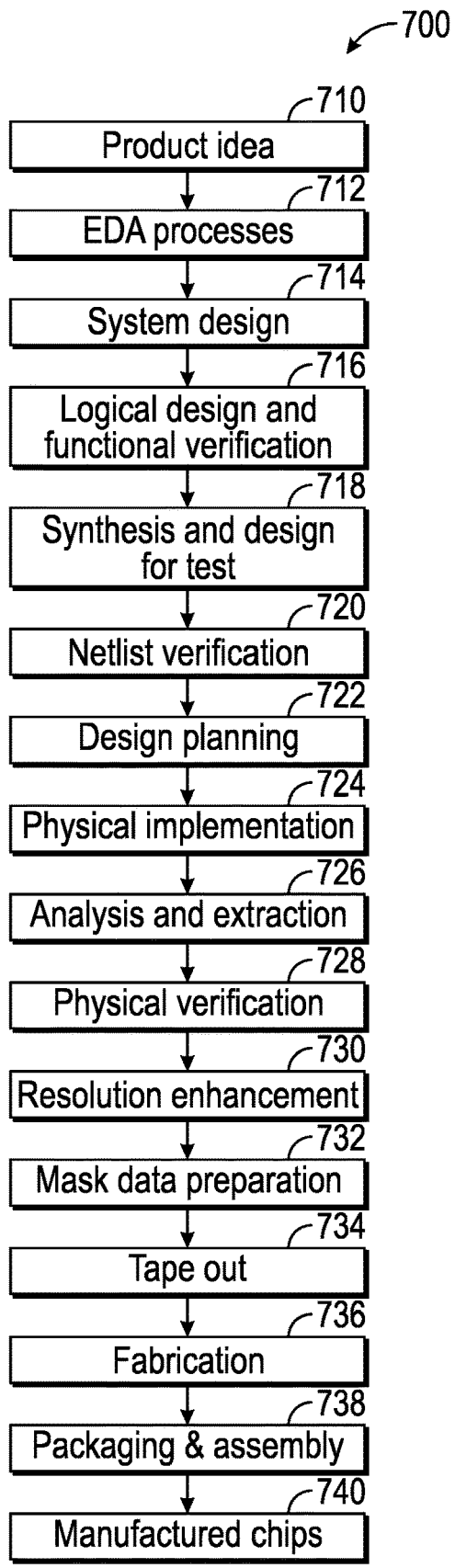
FIG. 7 is a flowchart of various operations in the design and fabrication of an integrated circuit, according to one embodiment.

FIG. 7 is a flowchart of various operations in the design and fabrication of an integrated circuit, according to one embodiment. FIG. 7 illustrates an example set of processes 700 used during the design, verification, and fabrication of an integrated circuit on a semiconductor die to transform and verify design data and instructions that represent the integrated circuit. Each of these processes can be structured and enabled as multiple modules or operations. The term "EDA" signifies Electronic Design Automation. These processes start, at block 710, with the creation of a product idea with information supplied by a designer, information that is transformed to create an integrated circuit that uses a set of EDA processes, at block 712. When the design is finalized, the design is taped-out, at block 734, which is when artwork (e.g., geometric patterns) for the integrated circuit is sent to a fabrication facility to manufacture the mask set, which is then used to manufacture the integrated circuit. After tape-out, at block 736, the integrated circuit is fabricated on a semiconductor die, and at block 738, packaging and assembly processes are performed to produce, at block 740, the finished integrated circuit (oftentimes, also referred to as "chip" or "integrated circuit chip").

Specifications for a circuit or electronic structure may range from low-level transistor material layouts to high-level description languages. A high-level of representation may be used to design circuits and systems, using a hardware description language (HDL) such as VHDL, Verilog, SystemVerilog, SystemC, MyHDL or OpenVera. The HDL description can be transformed to a logic-level RTL description, a gate-level description, a layout-level description, or a mask-level description. Each lower representation level that is a more detailed description adds more useful detail into the design description, such as, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 7. The processes described may be enabled by EDA products (or tools).

During system design, at block 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification, at block 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some examples, special systems of components, referred to as emulators or prototyping systems, are used to speed up the functional verification.

During synthesis and design for test, at block 718, HDL code is transformed to a netlist. In some examples, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification, at block 720, the netlist is checked for compliance with timing constraints and for correspondence with the HDL code. During design planning, at block 722, an overall floor plan for the integrated circuit is constructed and analyzed for timing and top-level routing.

During layout or physical implementation, at block 724, physical placement (positioning of circuit components, such as transistors or capacitors) and routing (connection of the circuit components by multiple conductors) occurs, and the selection of cells from a library to enable specific logic functions can be performed. As used herein, the term "cell" may specify a set of transistors, other components, and interconnections that provides a Boolean logic function (e.g., AND, OR, NOT, XOR) or a storage function (such as a flip-flop or latch). As used herein, a circuit "block" may refer to two or more cells. Both a cell and a circuit block can be referred to as a module or component and are enabled as both physical structures and in simulations. Parameters are specified for selected cells (based on standard cells) such as size and made accessible in a database for use by EDA products.

During analysis and extraction, at block 726, the circuit function is verified at the layout level, which permits refinement of the layout design. During physical verification, at block 728, the layout design is checked to ensure that manufacturing constraints are correct, such as design rule check (DRC) constraints, electrical constraints, lithographic constraints, and that circuitry function matches the HDL design specification. During resolution enhancement, at block 730, the geometry of the layout is transformed to improve how the circuit design is manufactured.

During tape-out, data is created to be used (after lithographic enhancements are applied if appropriate) for production of lithography masks. During mask data preparation, at block 732, the tape-out data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
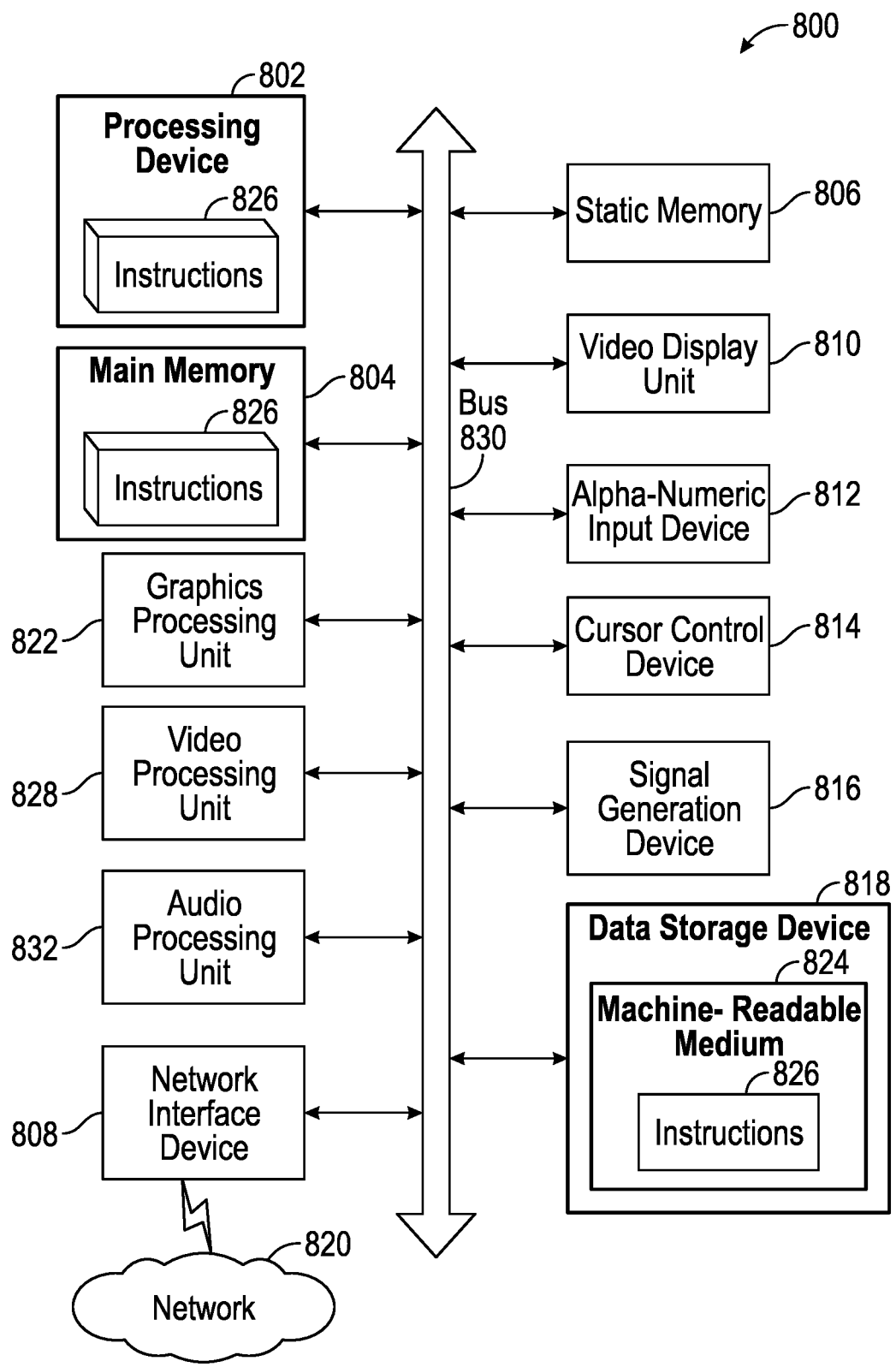
FIG. 8 depicts a diagram of an example computer system in which examples of the present disclosure may operate.

FIG. 8 illustrates an example of a computer system 800 within which a set of instructions, for causing the computer system to perform any one or more of the methodologies discussed herein, may be executed. In some implementations, the computer system may be connected (e.g., networked) to other machines or computer systems in a local area network (LAN), an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that computer system. Further, while a single computer system is illustrated, the term computer system shall also be taken to include any collection of computer systems that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830. The main memory 804 includes or is a non-transitory computer readable medium. The main memory 804 (e.g., a non-transitory computer readable medium) can store one or more sets of instructions 826, that when executed by the processing device 802, cause the processing device 802 to perform some or all of the operations, steps, methods, and processes described herein.

Processing device 802 represents one or more processors such as a microprocessor, a central processing unit, or the like. More particularly, the processing device 802 may be or include complex instruction set computing (CISC) microprocessor, reduced instruction set computing (RISC) microprocessor, very long instruction word (VLIW) microprocessor, a processor implementing other instruction sets, or processor(s) implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing some or all of the operations, steps, methods, and processes described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (e.g., a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also including machine-readable storage media.

In some implementations, the instructions 826 include instructions to implement functionality described above. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the computer system and that cause the computer system and the processing device 802 to perform any one or more of the methodologies described above. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
retrieving, by a controller in an integrated circuit (IC), first testing data from a first memory in the IC;
transmitting, by the controller, the first testing data to a first built-in self-test (BIST) core, wherein the IC comprises a system-on-chip (SoC) and wherein the first testing data is transmitted to the first memory during a period when the SoC is idle in its functional operation;
receiving, by the controller, a response from the first BIST core, relating to a test at the first BIST core using the first testing data; and
determining, by the controller, a status of the test based on the response from the first BIST core.

2. The method of claim 1, wherein the first BIST core is associated with a first ring comprising a first plurality of BIST cores, wherein the first ring is one of a plurality of rings in the IC, each of the plurality of rings comprising a respective plurality of BIST cores, and wherein transmitting the first testing data from the controller to the first BIST core associated with the first ring further comprises:
selecting the first BIST core based on transmitting a first instruction to a ring selector indicating selection of the first ring, wherein the first instruction is generated based on retrieving a corresponding second instruction from the first memory and decoding the second instruction.

3. The method of claim 1, further comprising:
triggering the controller based on receiving a message at the controller from a primary controller,
  wherein the controller is one of a plurality of secondary controllers associated with the primary controller,
  wherein each of the plurality of secondary controllers is associated with a respective ring, of a plurality of rings in the IC, and
  wherein the message is transmitted from the primary controller to the controller using a ring selector associated with the controller and configured to select among the plurality of rings.

4. The method of claim 1, wherein the first testing data comprises a plurality of data packets, and wherein the plurality of data packets are generated based on one or more generated test patterns and the packets are stored in the first memory.

5. The method of claim 1, wherein the status of the test relating to the IC relates to at least one of: (i) per-GIST-core testing, (ii) per interval testing, or (iii) per-test pattern testing.

6. The method of claim 5, wherein the status of the test relating to the IC relates to per-BIST-core testing, and wherein the test status comprises a failure status if any test relating to the first BIST core comprises a failure test.

7. The method of claim 5, wherein the status of the test relating to the IC relates to per interval testing for a plurality of intervals, wherein each interval comprises a set of test patterns for testing the IC, and wherein the first testing data relates to the set of test patterns.

8. The method of claim 5, wherein the status of the test relating to the IC relates to per-test pattern testing for a plurality of test patterns, wherein the first testing data relates to the plurality of test patterns.

9. The method of claim 1, further comprising:
retrieving a first digital signature from the first memory, wherein the first digital signature relates to the first testing data stored in the first memory;
receiving, by the controller, the first testing data from the first memory;
calculating a second digital signature, by the controller, based on the received first testing data; and
determining, by the controller, an error associated with the received testing data based a comparison between the first digital signature and the second digital signature.

10. The method of claim 1, further comprising:
retrieving, by the controller from a second memory, second testing data relating to the testing by the first BIST core based on corruption of the first testing data in the first memory; and
transmitting the second testing data from the controller to the first BIST core, wherein the received response from the first BIST core relates to the test at the first BIST core using both at least a portion of the first testing data, and the second testing data.

11. The method of claim 1, further comprising:
performing a self test, of the controller, using one or more instructions stored in the first memory, wherein the retrieving the first testing data from the first memory is based on determining that the self test is successful.

12. An integrated circuit (IC) comprising:
a plurality of rings, each ring comprising a respective plurality of built-in self-test (BIST) cores;
a ring selector;
a first memory storing instructions and
a controller, coupled with the first memory and to execute the instructions, the instructions, when executed, causing the controller to:
  retrieve testing data, wherein the testing data relates to testing by one of the plurality of BIST cores, wherein the testing data comprises a plurality of data packets, and wherein the plurality of data packets are generated based on one or more generated test patterns and the packets are stored in the first memory;
  transmit a first instruction to the ring selector indicating selection of a first ring, comprising a first BIST core, from the plurality of rings;
  transmit the testing data from the controller to the first BIST core;
  receive a response, at the controller from the first BIST core, relating to operation of a test at the first BIST core using the testing data; and
  determine a status of testing relating to the IC, at the controller, based on the response.

13. The IC of claim 12, wherein the testing data comprises a plurality of data packets, and wherein the plurality of data packets are generated based on one or more generated test patterns.

14. The IC of claim 12, the controller further:
retrieving a stored first digital signature, wherein the first digital signature relates to the testing data;
calculating a second digital signature using the testing data; and
determining an error associated with the received testing data based a comparison between the first digital signature and the second digital signature.

15. The IC of claim 12, wherein the testing data is retrieved from a second memory, the controller further:
retrieving, from a third memory, second testing data relating to the testing by the first BIST core based on corruption of the first testing data in the second memory; and
transmitting the second testing data from the controller to the first BIST core, wherein the received response relates to the test at the first BIST core using both at least a portion of the first testing data, and the second testing data.

16. The IC of claim 12, the controller:
performing a self test of the controller, using one or more stored instructions, wherein the retrieving the testing data from the memory is based on determining that the self test is successful.

17. A method comprising:
receiving, at a secondary controller in an integrated circuit (IC), a trigger message from a primary controller in the IC, wherein the secondary controller is one of a plurality of secondary controllers associated with the primary controller;
retrieving, using the secondary controller, testing data from a memory in the IC;
transmitting the testing data from the secondary controller to a first built-in self-test (BIST) core associated with a first ring comprising a first plurality of BIST cores, wherein the first ring is one of a plurality of rings in the IC, each of the plurality of rings comprising a respective plurality of BIST cores;
receiving a response, at the secondary controller from the first BIST core, relating to operation of a test at the first BIST core using the testing data; and determining, at the secondary controller, a status of testing relating to the IC based on the response.

18. The method of claim 17,
wherein each of the plurality of secondary controllers is associated with a respective ring, of the plurality of rings in the IC, and
wherein the trigger message is received at the secondary controller from the primary controller using a plurality of ring selectors configured to select among the plurality of rings.

19. The method of claim 17, wherein the testing data comprises a plurality of data packets, and wherein the plurality of data packets are generated based on one or more generated test patterns and the packets are stored in the memory.

\* \* \* \* \*